United States Patent [19]

Battail

[11] Patent Number: 4,811,346

[45] Date of Patent: Mar. 7, 1989

[54] PROCESS FOR THE DECODING OF A CONVOLUTIONAL CODE AND CORRESPONDING DECODER

[76] Inventor: Gérard Battail, 9 Place de Rungis, 75013 Paris, France

[21] Appl. No.: 892,828

[22] Filed: Aug. 1, 1986

[30] Foreign Application Priority Data

Aug. 2, 1985 [FR] France ................... 85 11863

[51] Int. Cl.$^4$ ........................................ G06F 11/10
[52] U.S. Cl. ................................................ 371/43
[58] Field of Search ...................... 371/43, 44, 45, 37

[56] References Cited

U.S. PATENT DOCUMENTS

| | | | |
|---|---|---|---|
| 3,457,562 | 7/1969 | Fano . | |
| 4,015,238 | 3/1977 | Davis | 371/43 |
| 4,087,787 | 5/1978 | Acampora . | |
| 4,322,848 | 3/1982 | Snyder, Jr. | 371/43 |
| 4,328,582 | 5/1982 | Battail | 371/43 X |
| 4,404,674 | 9/1983 | Rhodes | 371/43 |
| 4,519,080 | 5/1985 | Snyder | 371/43 |
| 4,583,078 | 4/1986 | Shenoy | 371/43 X |

OTHER PUBLICATIONS

IBM Technical Disclosure Bulletin, (Dec. 1970), F. Jelinek, "Fast Sequential Decoding Algorithm", pp. 1775-1779.
IEEE Transactions on Communications (Feb. 1983), J. Conan, "An F8 Microprocessor-Based Breadboard", pp. 165-171.
IEEE Transactions on Information Theory (Nov. 1975), D. Haccoun, "Generalized Stack Algorithms", pp. 638-651.
IEEE Transactions on Communications Technology (Oct. 1971), A. J. Veterbi, "Convolutional Codes and Their Performance", pp. 751-772.

Primary Examiner—Jerry Smith
Assistant Examiner—Robert W. Beausoliel
Attorney, Agent, or Firm—Nutter, McClennen & Fish

[57] ABSTRACT

A decoding process suitable for space links decodes a sequence of symbols received from a disturbed channel resulting from the convolutional coding of a sequence of information symbols to be transmitted. The trellis of the states of the coder is defined and, as a function of the symbols received, the most likely path in the trellis is determined and this defines the most probable sequence of symbols transmitted. At each node of the trellis, the most probable path or survivor is determined by a sequence of algebraic values indicating a sequence of transmitted symbols and the likelihood of each of these symbols and by measuring the cumulative likelihood of the sequence.

In a characteristic manner, the sequence of algebraic values at a node is established by a weighted shifted transfer, each algebraic value of the sequence being a function of all the algebraic values of the same node level of the sequences of algebraic values of the antecedents of the node and being a function of the algebraic value corresponding to the transition between those antecedents and the node.

6 Claims, 3 Drawing Sheets

PROCESS FOR THE DECODING OF A CONVOLUTIONAL CODE AND CORRESPONDING DECODER

BACKGROUND OF THE INVENTION

The present invention relates to a process for decoding a sequence of symbols received from a disturbed channel resulting from the convolutional coding of a sequence of information symbols to be transmitted.

Convolutional codes, which are also called convolutive, recurrent, sequential or tree codes are particularly used in space links, which are highly disturbed or interfered with by thermal noise and are effectively protected by using an internal convolutional code concatenated with an external code, generally of the Reed-Solomon type.

The symbols to be transmitted and the symbols of the convolutional code are taken in a q-area alphabet which, in most applications, is the binary alphabet (q=2) because, for larger size alphabets (q>2), the coder and particularly decoder soon become too complex. For these reasons, reference is almost exclusively made to the case where q=2 throughout the remainder of the description. Mention will only be made of the general case (q≠2) when the transposition of the case q=2 to the case q≠2 is not immediate to the Expert.

It is pointed out that a convolutional code is produced by a linear combination of symbols stored in a register supplied and shifted by the symbols to be transmitted. The classic example of a convolutional coder is shown in FIG. 1. This coder comprises two lag or delay elements 2, 4 in series constituting a shift register, a first adder 6 for forming the modulo 2 sum of the information symbol applied to the coder input E and two delayed symbols and a second adder for forming the modulo 2 sum of the information symbol applied to the coder input E and the delayed symbol supplied by delay element 4. The coder input E corresponds to the input of delay element 2. The outputs of the coder are constituted by the outputs of adders 6, 8.

The information symbols enter one by one into the coder of FIG. 1. The introduction of each information symbol leads to the transmission of two coded symbols, obtained by linear combination of the symbol which has just been introduced and two preceding delayed symbols (m in the general case where m≠0). The state of the coder is defined by the vector having as components the delayed symbols.

In general terms, symbols enter k by k into the coder, each of them being applied to the input of a shift register. The introduction of each group of k information symbols leads to the transmission of n coded symbols (n>k) obtained by linear combination of k symbols which have just been introduced and mk preceding delayed symbols (m≠0).

In a conventional manner, the convolutional code is decoded by means of the Viterbi algorithm. This algorithm, which is more particularly described in the article "Error bounds for convolutional codes and an asymptically optimum decoding algorithm", IEEE Trans. on Inf. Theory, IT-13, 1967, pp 260-269 by A. J. VITERBI is an optimum decoding means is the sense of maximum likelihood. It can be interpreted as a means for estimating the sequence of the states of the coder and therefore the sequence of the information symbols, from the sequence of coded symbols, received through a disturbed channel.

Reference will now be made to the principle of the Viterbi algorithm. It is firstly pointed out that as the information symbols are discrete, the number of states is finite. This number is equal to 4 in the case of FIG. 1 and to $q^{km}$ in general. Thus, the same state can be reached from two states which only differ by the oldest symbol present in the coder memory, because this symbol disappears therefrom as from the shift resulting from the introduction of a new information symbol. This symbol is called the "outgoing symbol" and the two stages ($q^k$ stages in general) leading directly to the considered states are called its antecedents.

If a random effectively reached state is assumed, a decision can be taken with regards to the outgoing symbol, because the subsequently received coded symbols stop definitively depending thereon and therefore obtaining information thereon. The Viterbi algorithm consists of taking a definitive or final decision with regards to the outgoing symbol for each of the possible states. The choice of a single state at each instant is only subsequently determined, following a random number of subsequent decisions, because the advance of the algorithm tends to eliminate any succession of states incompatible with the register structure of the coder.

The operation of the algorithm is conventionally illustrated by the lattice diagram proposed by G. D. FORNEY Jr. in the article "The Viterbi Algorithm", Proc. IEEE, 61, No. 3, March, 1973, pp 268–278.

FIG. 2 is the diagram of the lattice corresponding to the coder of FIG. 1. The integral abscissa represents the time and the integral ordinate each of the states. The thus determined discrete points are called nodes and their abscissa is designated by the node level. The possible transitions between the nodes are represented by branches oriented from left to right (directions of the rising node levels). Any connected sequence of branches, to which corresponds a possible sequence of information symbols and the corresponding sequence of coded symbols is called the path. In the diagram, the branches in continuous lines and broken lines respectively represent the information symbols 0 and 1. The pairs of bits associated with each branch are corresponding coded symbols.

The decoding of a sequence of coded symbols received is translated in this representation of the algorithm by the determination of the best path for the likelihood criterion. For each node, the highest likelihood path converging there is determined and all that is left is the maximum likelihood path.

The known algorithm described hereinbefore makes it possible to obtain the best possible estimate of the sequence of states and therefore of the sequence of information symbols. However, this process gives no information on the reliability of the givan information symbols. However, this information makes it possible to improve decoding in certain special cases, which are particularly of interest for space links.

It has already been stated that in this case use is made of an internal convolutional code concatenated with an external code of the Reed-Solomon type. Following the decoding of the convolutional code, the residual errors are generally grouped in short packets corrected by the Reed-Solomon code with a particular efficiency. However, the decoding of the external code can be greatly improved if these error packets are localized and more particularly if the symbols to be decoded are weighted as a function of their reliability.

This reliability information is available in principle, because any demodulation or decoding decision can be interpreted as deduced from a comparison of the probabilities of the various possible hypotheses. Thus, the only problem is to make this information explicit. Moreover, an overall estimate of the reliability of the decision relating to a long sequence of information symbols would hardly be useful because, in the case of concatenated decoding, it is at least wished to locate the residual error packets.

The weighting of decoded symbols is already known per se in the case of linear codes, which include convolutional codes. For a complete description, reference can e.g. be made to the article "Décodage par répliques" which appeared in Annales des Télécommunications, vol. 31, No. 11–12, Nov.–Dec. 1976, pp 387–404 by G. Battail and M. Decouvelaere.

The conventional putting into use of the Viterbi algorithm consists of associating two memories with each of the possible states. One of them contains the best sequence of information symbols leading to this state and which is called the survivor. The other contains a measurement of the cumulative likelihood of this sequence. The content of the memories is deduced from that of the memories associated with the antecedent node located on the best path. The cumulative likelihood is modified by the addition of that of the branch leading to the considered node. The sequence of symbols is copied out and increased by the final determined symbol. In order to avoid the need of keeping in the memory a sequence of symbols whose length increases indefinitely with time, use is made of a register of adequate length L, where the content of the preceding register is transferred and shifted by the introduction of the final determined symbol (reference will be made hereinafter to the term "shifted transfer" to designate this operation). The symbols leaving the registers associated with the different states are almost always identical (if the register is long enough) and their sequence constitutes the definitive result of the decoding.

Details will now be given as to how symbol-by-symbol weighting is obtained. This known weighting will be described in the particular case where the symbols are binary and are designated "0" and "1". Thus, the decoder output can simply be connected to that of one of the registers associated with the states and chosen in an arbitrary manner. However, it is preferable to take as the decoded information symbol, the result of a majority decision on all the symbols simultaneously leaving the registers associated with the states (reference can be made in this connection to the book by A. J. Viterbi and J. K. Omura "Principles of Digital Communication and Coding", McGraw-Hill, 1979).

For a given node, the difference between the cumulative likelihoods of the two paths leading thereto is equal to the algebraic value of the outgoing symbol, by the very definition of this magnitude, i.e. the logarithm of the ratio of the probabilities of realizing the two hypotheses "0 transmitter" and "1 transmitter". Its sign consequently indicates which is the determined symbol ("+" corresponds to "0" and "−" to "1"), while its absolute value measures the reliability of the decision taken. In particular, it is zero in the case of indeterminacy where these two probabilities are equal. A weighting of the desired form is obtained by placing in the memory for each state, the sequence of the algebraic values calculated in this way instead of the sequence of symbols only.

Thus, the same number of sequences of algebraic values are obtained as there are possible states. Then, as in the algorithm in its conventional form, it is possible only to retain the sequence of algebraic values associated with each survivor, so that nothing is changed in the shifted transfer, except that the symbols are replaced by real numbers. This simple solution is not completely satisfactory. Thus, the choice of the outgoing symbol from a node can be taken with a small margin, whereas the sequences of algebraic values associated with each of the paths converging there can be very different.

SUMMARY OF THE INVENTION

The invention consists of improving the sequence of surviving algebraic values in a node by taking account of the two paths used for the determination thereof, i.e. taking account of the two sequences of algebraic values associated with each of the antecedents of the considered node.

More specifically, if $x'$ and $x''$ are two algebraic values corresponding to the same node level and respectively belonging to the sequences surviving in the antecedents of the considered node and if z is the difference of the likelihoods of the two paths leading to the considered node, i.e. the last given algebraic value, the process of the invention consists of weighting the possibility of the information symbols corresponding to $x'$ and $x''$ of each of the two paths by the probability of said path, provided that it leads to the node in question. This weighting is performed for each pair of algebraic values corresponding to the same node level of the paths of the antecedents of the considered node.

The invention also applies to the non-binary case ($q \neq 2$). The real number constituting the algebraic value is then replaced by a vector of $q-1$ real numbers, whereof the component ($1 \leq i \leq q-1$) is defined as the logarithm of the ratio of probabilities of the two hypotheses "0 transmitter" and "1 transmitter" (the symbols of the q-area alphabet being designated $0, 1, 2, \ldots i, \ldots, q-1$).

The invention also relates to a decoder for performing the process.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
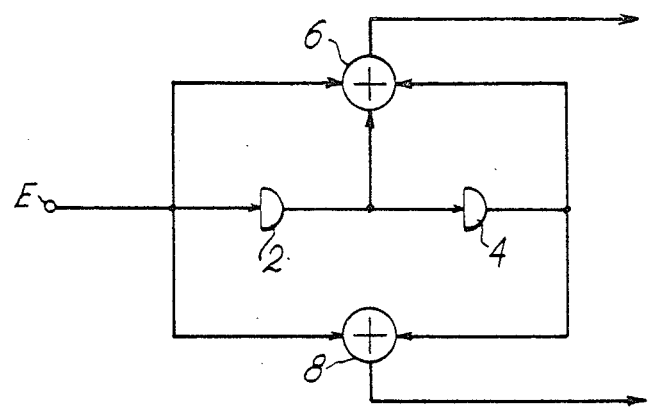
FIG. 1 Already described, an example of a conventional convolutional coder.
Figure 2:
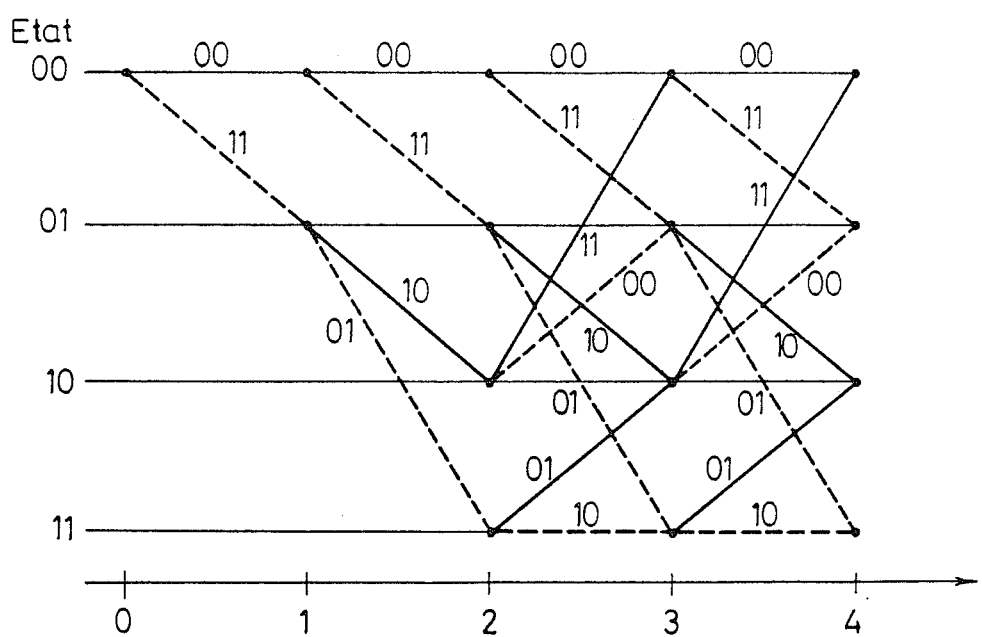
FIG. 2 Already described, the diagram of the lattice associated with the coder of FIG. 1 conventionally used for decoding.
Figure 3:
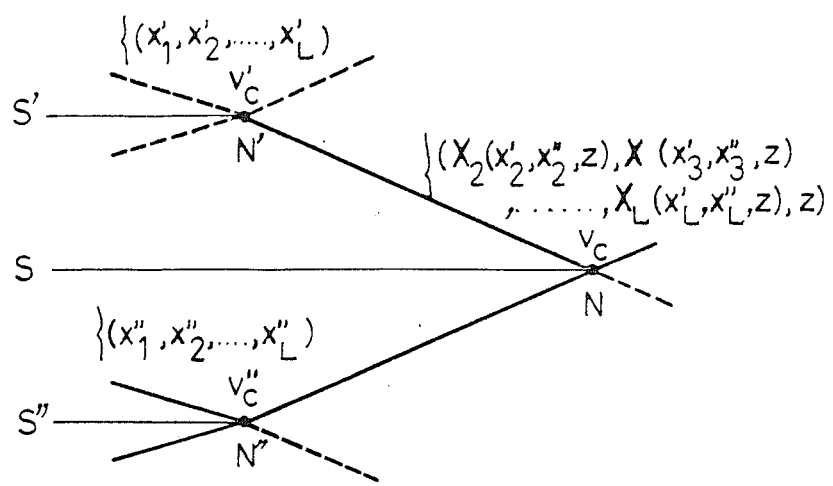
FIG. 3 A lattice element showing the weighting according to the invention.

FIG. 3 shows a trellis element comprising a node N of ordinate S (i.e. state) and its two antecedents N' and N" of states S' and S". The most likely path or survivor at node N' is defined by the sequence of relative values $x'_1$, $x'_2, \ldots x'_L$. The reliability attached to this sequence, also called cumulative likelihood, is designated $v'_c$. In the same way, for node N" at the same level as node N', the most likely path is defined by the sequence of algebraic values $x''_1, x''_2, \ldots x''_L$. The cumulative likelihood of this path is designated $v''_c$.

In the prior art decoding process, the choice of the final determined symbol corresponding to the transition between the level of nodes N', N" and node N directly fixes the sequence of algebraic values associated with node N. If the algebraic value z corresponding to the final determined symbol is positive, the most likely path is that from node N' and the sequence of algebraic values associated with node N is then $x'_2, x'_3, \ldots, x'_L$, z. It is obtained by simple shifted transfer of the sequence of algebraic values associated with node N'. In the same way, if the algebraic value z is negative, the sequence of algebraic values associated with node N is $x''_2, x''_3, \ldots x''_L$, z. It is also obtained by simple shifted transfer of the sequence of algebraic values associated with node N".

The algebraic value z thus determines choices between algebraic values $x'_2$ and $x''_2$, $x'_3$ and $x''_3, \ldots x'_L$ and $x''_L$. However, the two algebraic values associated with the same node level $x'_i$ and $x''_i$ (in which $2 \leq i \leq L$) can correspond to very reliable estimated binary values (large modules), but which are still contradictory (opposite signs).

However, in the process of the invention, the choice of one sequence of algebraic values in preference to another is replaced by a weighted decision as a function of the likelihood of the two compared paths. All the algebraic values, except the last, of the sequence of algebraic values $X_2, X_3, \ldots X_L$, z associated with the surviving path at the level of node N are thus a function of the algebraic values of the same node level of the two compared paths and of the algebraic value z. The weighted decision of the algebraic values $X_2, \ldots X_L$ is itself revised during the determination of the survivors corresponding to the nodes of the following levels.

The expression of a revised algebraic value X as a function of the algebraic values x', x" and z is obtained in the following way. On designating by b the outgoing symbol corresponding to the common node level to x' and x" and d is the final determined outgoing symbol corresponding to z, we obtain by definition algebraic values:

$$Pr(b = 0 | d = 0) = 1/(1 + e^{-x'})$$

$$Pr(b = 0 | d = 1) = 1/(1 + e^{-x''})$$

$$Pr(d = 0) = 1/(1 + e^{-z}) \text{ and}$$

$$Pr(d = 1) = 1/(1 + e^{z})$$

in which Pr(A/B) is the probability of event A conditional on event B, Pr(A) is the probability of event A.

The probability of having b=0 taking account of x', x" and z (exclusively) is therefore:

$$1/(1+e^{-X}) = Pr(b=0/d=0) \cdot Pr(d=0) + Pr(b=0/d=1) \cdot Pr(d=1)$$

which gives, after transformation:

$$X = \log_2(e^{x''} + e^{x'+x''} + e^{x''+z} + e^{x'+x''+z}) - \log_e(1 + e^{x'} + e^{x''} + e^{x''+z})$$

Thus, it can be seen that it is monotonic function of z for x' and x" which are given, varying from x" (for $z = -\infty$) to x' (for $z = +\infty$). The replacement of z by $-z$ and the interchange of x' and x" leave this expression unchanged.

The complication of this exact expression makes it difficult to use. The considerable variation of the exponential function suggests the replacement thereof by the expression deduced therefrom while only retaining in each bracket the largest of the exponential functions. The revised relative value then becomes approximately:

$$X = \max(x'', x'+x'', x'+z, x'+x''+z) - \max(0, x', z, x''+z) = f(x', x'', z),$$

in which max is the maximum function. This approximation is sometimes rough, but is adequate in most cases.

Figure 4:
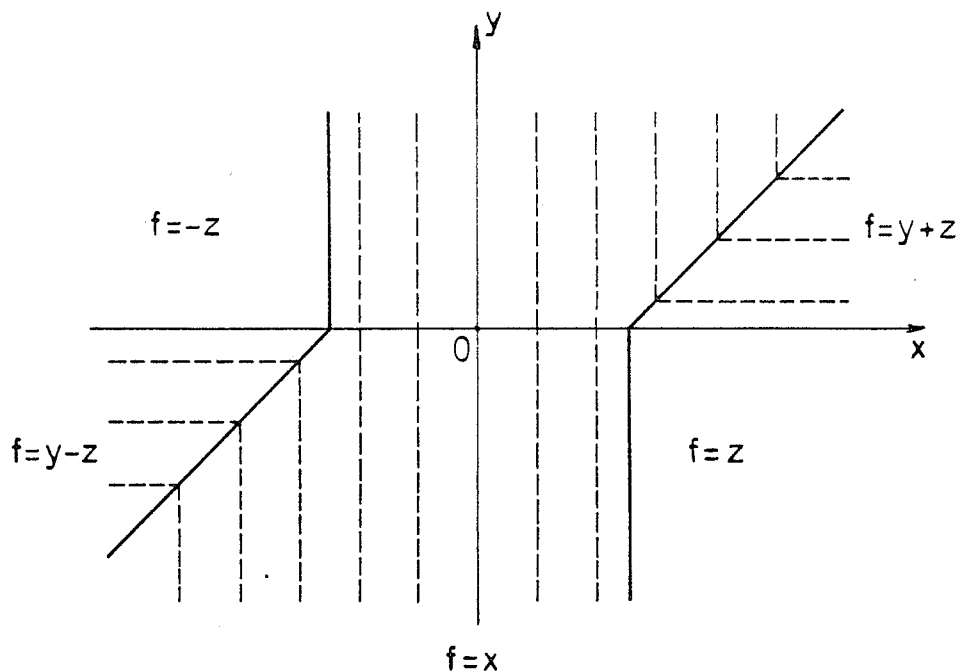
FIG. 4 A graph showing the revised algebraic value according to the invention as a function of the algebraic values $x'$ and $x''$ and the relative value z.

The function f(x',x",z) is represented in FIG. 4 for $z > 0$. The form obtained for z negative is deduced therefrom by symmetry because $f(x',x'',z) = f(x'',x',-z)$. The dotted lines are level lines f=constant.

Examination thereof shows that the revision of the algebraic values using the simplified formula contains nothing in the central area where $f(x',x'',z) = x'$. The existence of "plateaus" at z and $-z$ shows that this revision has the effect of limiting the modulus of the algebraic value to that of z, when x' and x" are of large modulus and opposite signs, i.e. corresponding to very reliable estimated binary decisions, but which are nevertheless contradictory. The discussion of the exact formula of the revised value, which is somewhat more complicated, leads to identical conclusions.

A description will now be given of a decoder for performing the process according to the invention. Conventionally, a decoder can be constituted by a group of identical modules, one module being associated with each state of the trellis and the different modules are interconnected according to the antecedence relationships.

Figure 5:
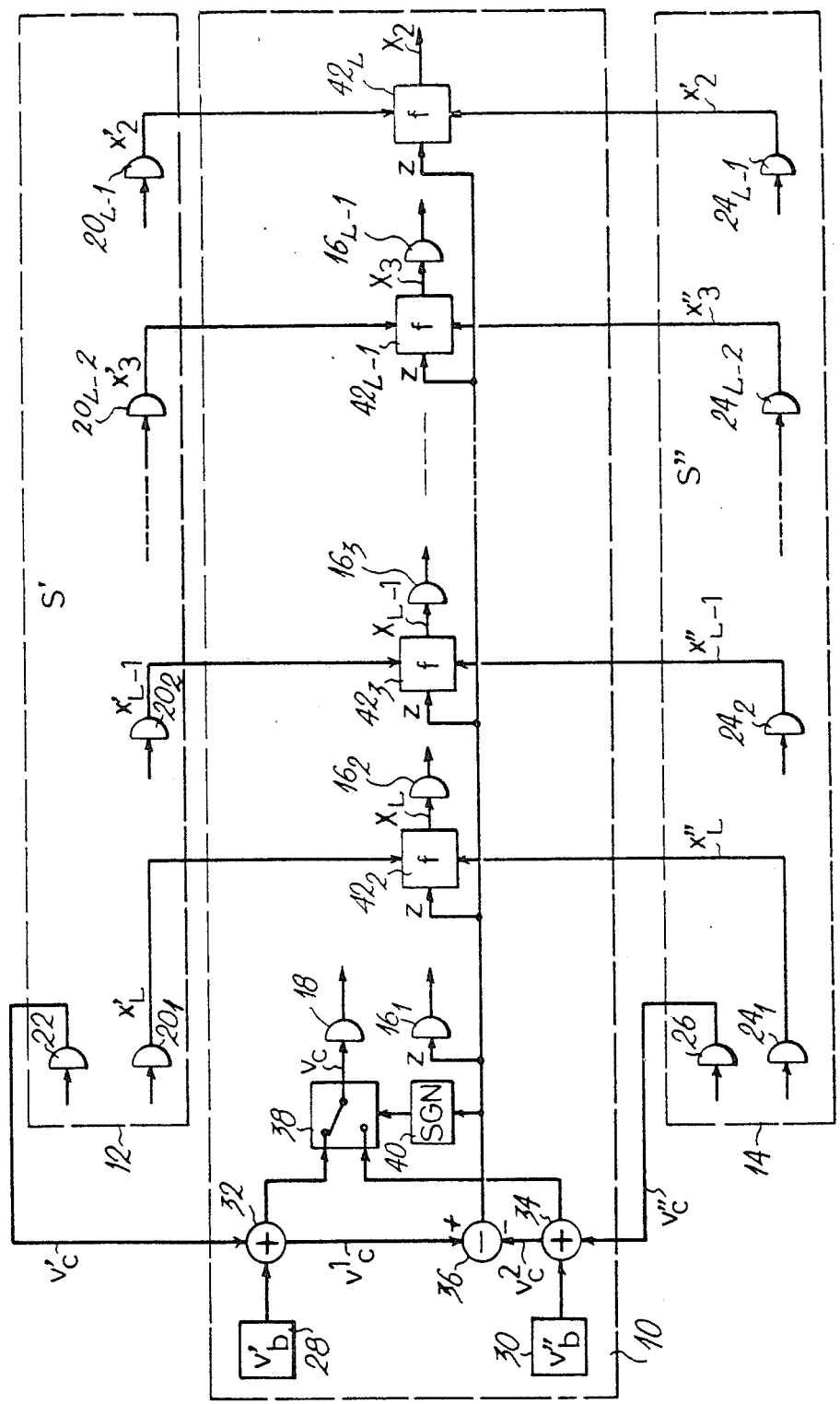
FIG. 5 An embodiment of a module of the decoder of the invention, the complete decoder being constituted by a group of identical modules, each module being associated with one state and the different modules being interconnected according to the antecedence relationships in the lattice associated with the coder.

FIG. 5 shows module 10 of a state S, which is the ordinate of a node N at a given time and the main elements of modules 12 and 14 associated with states S' and S" corresponding to the antecedents N' and N" of node N. Module 10 comprises a group of identical memories $16_1, 16_2, \ldots 16_{L-1}$, which can be delay elements, for storing the sequence of algebraic values associated with state S, with the exception of the oldest algebraic value, because the latter disappears during the shifted transfer. It also comprises an analog memory 18 for storing the cumulative likelihood $v_c$ of the most likely path leading to state S. Modules 12 and 14 comprise in a similar manner analog memories $20_1, 20_2, \ldots 20_{L-1}$ and 22 for state S' and analog memories $24_1, 24_2, \ldots 24_{L-1}$ and 26 for state S".

Conventionally, module 10 also comprises means for calculating the algebraic value corresponding to the transition between states S' and S", on the one hand, and state S, on the other. These means are constituted by a means 28 for calculating the likelihood $v'_b$ of the symbol associated with the branch between nodes N' and N of respective states S' and S, a means 30 for calculating the likelihood $v''_b$ of the symbol associated with the branch between nodes N" and N of respective states S" and S, an adder 32 for producing the cumulative likelihood $v_c^1$ equal to $v'_c + v'_b$, an adder 34 for producing the cumulative likelihood $v_c^2$ equal to $v_c 41 + v_b''$, a subtracter 36 for producing the algebraic value z equal to $v_c^1 - v_c^2$ and a switch 38 controlled by a means 40 receiving at the input the algebraic value z and which supplies the cumulative likelihood $v_c$ associated with the surviving path of node N of state S. This cumulative likelihood $v_c$ is the greatest of the two cumulative likelihoods $v_c^1$ and $v_c^2$.

Each module of the decoder according to the invention also conventionally comprises processing means $42_2$, $42_3$, ... $42_{L-1}$ positioned upstream of the analog memories $16_2$, $16_3$... $16_{L-}$ and a final processing means $42_L$. Each processing means has three inputs respectively receiving a algebraic value $x'_i$, $2 \leq i \leq L$ from module 12 of antecedent S'; a algebraic value $x''_i$, $2 \leq i \leq L$ from module 14 of antecedent S"; and algebraic value z produced by subtracter 36.

The connections between the analog memories of module 12, 14 of states S', S" with the processing means of module 10 of state S and the connections between these processing means and the analog memories of module 10 make it possible to carry out a weighted shifted transfer of the sequences of algebraic values of modules 12, 14 into module 10.

The processing means produce revised algebraic values $X_2$, $X_3$, ... $X_n$ in accordance with the equations given hereinbefore. As in the case of unweighted binary decisions, the decoder output can be simply connected to that of any one of the registers for the algebraic values associated with the states. However, it is preferable to take as the definitive result of the decoding, the arithmetic mean of the algebraic values simultaneously leaving all the registers associated with the states.

In the prior art decoders, these processing means simply comprise switches which are simultaneously controlled to carry out an unweighted shifted transfer either of the sequence of algebraic values corresponding to state S', or to the sequence of algebraic values corresponding to state S".

In the previous description, the invention has been represented in the particular case where the symbols are taken in a binary alphabet and are presented one by one in a coder, in order not to overburden the description. However, it is obvious that the process and decoder can be easily transposed for adaptation to the general case where $q \neq 2$. The only difference between the particular case $q=2$ and the general case is the transposition of the notion of the algebraic value, so that this point will be defined.

In an alphabet of size q, the vectorial algebraic value is defined as a vector a of dimension $q-1$ having for the $i^{th}$ component:

$$a_i = \log_e (Pr(s=0)) = \log_e (Pr(s=i)), i=1, 2, \ldots, q-1$$

completed, if necessary, by a component of index 0 taken systematically as being equal to 0.

This definition is in part arbitrary, because it gives a particular function to the symbol "0". However, it has the advantage that the vector a is reduced to a scalar quantity equal to the algebraic value, such as defined during the description, in the case where $q=2$.

With this definition, the calculation of the revised vectorial algebraic value is immediately transposed from the case $q=2$. If s is the outgoing symbol corresponding to a certain node level smaller than the level reached and d the final determined outgoing symbol for a given state and if $a^j$ is the vector of the algebraic values associated therewith in the hypothesis where the final decision is in favour of j and z that which is associated with the final decision (i.e. determined from the difference of the likelihoods associated with the various paths converging at the considered node), we obtain:

$$Pr(s=i/d=j) = \exp(-a_i^j). \ Pr(s=0/d=j) \text{ and}$$

$$Pr(d=j) = \exp(-z_j). \ Pr(d=0).$$

Moreover, the equality of 1 of the sum of the likelihood $Pr(s=i/d=J)$ for i from 0 to $q-1$ leads to:

$$Pr(s=0|d=j) + Pr(s=0|d=j). \sum_{k=1}^{q-1} \exp(-a_k^j) = 1, \text{ so that}$$

$$Pr(s=0|d=j) = 1 / \left(1 + \sum_{k=1}^{q-1} \exp(-a_k^j)\right).$$

If R is the symbol revised as a function of the new decision d and A the vector of the algebraic values associated therewith, we obtain:

$$Pr(R = i) =$$

$$Pr(d = 0). \sum_{j=0}^{q-1} \exp(-a_i^j - z_j) / \left(1 + \sum_{k=1}^{q-1} \exp(-a_k^j)\right)$$

The ith component of the vector A is consequently:

$$A_i = \log_e \left( \sum_{j=0}^{q-1} \exp(-z_j) / \left(1 + \sum_{k=1}^{q-1} \exp(-a_k^j)\right) \right)$$

$$-\log_e \left( \sum_{j=0}^{q-1} \exp(-a_i^j - z_j) / \left(1 + \sum_{k=1}^{q-1} \exp(-a_k^j)\right) \right).$$

This expression is not simple. As in the binary case, it can be brought into the form of a logarithm of a ratio of exponential sums, but the number of terms in the numerator and denominator increases like $q^q$, q being the size of the alphabet.

In the very general case where the input symbols are introduced k by k (and not one by one), it is necessary to replace above q by $q^k$. The components $a_i^j$ becomes the sum of quantities of the same form separately associated with each of the k symbols introduced. Thus, calculation is formally identical, but much more complex in practice.

What is claimed is:

1. A process for decoding a sequence of binary symbols received from a disturbed channel resulting from the convolutional coding achieved by a coder of a sequence of binary information symbols to be transmitted, in which said binary information symbols are introduced one by one into said coder, said process comprising the steps of:

determining the trellis of the states of the coder, said trellis comprising a system of nodes and branches, the nodes being arranged by states of $2^m$ nodes, in which m is the number of symbols delayed in the coder, each node of a given state being connected to two nodes of the preceding state, called antecedents, by two branches corresponding to two binary information symbols;

determining as a function of the sequence of binary symbols received, the path of greatest likelihood in the trellis to know the most probable sequence of binary information symbols transmitted, said path being determined by recurrence on the states of successive nodes while retaining, for each node, the most probable path, called the survivor, from among the two paths leading to it and passing through the antecedents of said node; and determining the survivor in each node by a sequence of algebraic values $x'_1 - x_L$; $x''_1 - x''_L$ indicating a sequence of binary symbols and the likelihood of each of these symbols, and by a measurement $v'_c$, $v''_c$ of the cumulative likelihood of said sequence, said process comprising also the steps of calculating the sequence of algebraic values of a node $x_2 - x_L$, in function of the algebraic values of the antecedents of said node $x''_1 - x'_L$, z and $x''_1 - x''_L$, z; $x_2$ being a function of $x'_2$, $x''_2$, z ... $x_L$ being a function of $x'_L$, $x''_L$, z; and determining the final algebraic value of the sequence of algebraic values of said node as the algebraic value z corresponding to the transition between said antecedents and said node.

2. A process according to claim 1, wherein each algebraic value X of the sequence of algebraic values associated with a node, except the final algebraic value z, is calculated according to the expression:

$$X = \log_e(e^{x''_L} + e^{x'_L + x''_L} + e^{x'_L + z} + e^{x'_L + x''_L + z}) - \log_e(1 + e^{x'_L} + e^z + e^{x''_L + z}).$$

3. A process according to claim 1, wherein each algebraic value x of the sequence of relative values associated with a node, except the final algebraic value z, is calculated according to the expression:

$$X = \max(x'', x' + x'', x' + z, x' + x'' + z) - \max(0, x', z, x'' + z).$$

4. A process for decoding a sequence of q-area symbols received from a disturbed channel, resulting from the convolutional coding of a sequence of q-area binary information symbols to be transmitted comprising first the steps of:

introducing k by k into a coder said binary information symbols;

defining the trellis of the coder, said trellis comprising a system of nodes and branches;

arranging the nodes by levels of $q^{km}$ nodes, in which m is the number of groups of k symbols delayed in the coder;

connecting each node of a given level to $q^k$ nodes of the preceding level, called antecedents, by $q^k$ branches corresponding to $q^k$ q-area information symbols;

determining the most likely path in the trellis as a function of the sequence of q-area symbols received, this path defining the most probable sequence of q-area information symbols transmitted, said path being determined by recurrence on the successive node levels while retaining, for each node, the most probable path, called the survivor, from among the $q^k$ paths leading thereto and passing through the antecedents of said node;

defining the survivor at each node by a sequence of vectors, each vector having q-1 components, the ith component ($1 \leq i \leq q-1$) being a function of the ratio of the probabilities "symbol 0 transmitter" and the "symbol i transmitter";

defining the survivor at each node by a measurement of the cumulative likelihood of said sequence, the process comprising also the following steps of:

establishing the sequence of vectors associated with a node by a weighted shifted transfer of all the sequences of vectors corresponding to the antecedents of said node;

determining each component of each vector of the sequence of vectors of said node, with the exception of the last vector of the sequence, as a function of the components of the vectors corresponding to the nodes of the same level of the sequences of vectors of said antecedents and of the vector corresponding to the transition between said antecedents and said node; and determining the final vector of the sequence of vectors of said node as being equal to the vector corresponding to the transition between said antecedents and said node.

5. A decoder for decoding a sequence of binary symbols received from a disturbed channel resulting from the convolutional coding achieved by a coder of a sequence of binary information symbols to be transmitted, in which said binary information symbols are introduced one by one into said coder, said coder having different states constituting a trellis:

which comprises a system of nodes and branches, the nodes being arranged by states of $2^m$ nodes, in which m is the number of symbols delayed in the coder, each node of a given state being connected to two nodes of the preceding state, called antecedents, by two branches corresponding to two binary information symbols;

in which the path of greatest likelihood in the trellis is defined as a function of the sequence of binary symbols to know the most probable sequence of binary information symbols transmitted, said path being determined by recurrence on the states of successive nodes while retaining, for each node, the most probably path, called the survivor, from among the two paths leading to it and passing through the antecedents of said node; and in which the survivor is determined in each node by a sequence of algebraic values $x'_1 - x_L$; $x''_1 - x''_L$ indicating a sequence of binary symbols and the likelihood of each of these symbols, and by a measurement $v'_c$, $v''_c$ of the cumulative likelihoods of said sequence;

in which the sequence of algebraic values of a node $x_2 - x_L$, is calculated in function of the algebraic values of the antecedents of said node $x'_1 - x'_L$, z and $x''_1 - x''_L$, z; $x_2$ being a function of $x'_2$, $x''_2$, z ... $x_L$ being a function of $x'_L$, $x''_L$, z; and in which the final algebraic value of the sequence of algebraic values of said node is determined as the algebraic value z corresponding to the transition between said antecedents and said node, said decoder comprising a module for each state and a means for connecting the modules in accordance with the antecedence relationships of the nodes of the trellis corresponding to the coder, wherein each module receives a sequence of algebraic values of a node and comprises:

a system of analog memories for storing the sequence of algebraic values corresponding to the node with the exception of the oldest relative value;

a means for receiving the cumulative likelihoods $v'_c$ and $v''_c$ of the antecedents and the likelihoods $v'_b$ and $v''_b$ of branches connecting the antecedents to the node for calculating the cumulative likelihood as a function of the cumulative likelihoods $v'_c$ and $v''_c$ of the antecedents and the likelihoods $v'_b$ and $v''_b$ of the branches and for calculating the algebraic value z; and a group of processing means, each having three inputs for receiving the relative value z, a relative value x' of the sequence of relative values of an antecedent of the node and the relative value x'' of the sequence of relative values of the other antecedent of the node, corresponding to the same node level as the relative value x', each processing means supplying on an output a revised value applied, except for the oldest revised value, to an input of an analog memory.

6. A decoder for decoding a sequence of binary symbols received from a disturbed channel resulting from the convolutional coding achieved by a coder of a sequence of binary information symbols to be transmitted, in which said binary information symbols are introduced one by one into said coder, said coder having different states constituting a trellis:

which comprises a system of nodes and branches, the nodes being arranged by states of $2^m$ nodes, in which m is the number of symbols delayed in the coder, each node of a given state being connected to two nodes of the preceding state, called antecedents, by two branches corresponding to two binary information symbols;

in which the path of greatest likelihood in the trellis is defined as a function of the sequence of binary symbols to know the most probable sequence of binary information symbols transmitted, said path being determined by recurrence on the states of successive nodes while retaining, for each node, the most probably path, called the survivor, from among the two paths leading to it and passing through the antecedents of said node; and in which the survivor is determined in each node by a sequence of algebraic values $x'_1 - x_L$; $x''_1 - x''_L$ indicating a sequence of binary symbols and the likelihood of each of these symbols, and by a measurement $v'_c$, $v''_c$ of the cumulative likelihoods of said sequence;

in which the sequence of algebraic values of a node $x_2 - x_L$, is calculated in function of the algebraic values of the antecedents of said node $x'_1 - x'_L$, z and $x''_1 - x''_L$, z; $x_2$ being a function of $x'_2$, $x''_2$, z . . . $x_L$ being a function of $x'_L$, $x''_L$, z; and in which the final algebraic value of the sequence of algebraic values of said node is determined as the algebraic value z corresponding to the transition between said antecedents and said node, said decoder having a defined trellis of its states comprising a module for each state and a means for connecting the modules in accordance with the antecedence relationships of the trellis corresponding to the coder, wherein each module comprises a group of analog memories for storing the sequence of vectors corresponding to the node, except the oldest vector;

an analog memory for receiving the cumulative likelihood of the path represented by the sequence of vectors for storing them;

means for receiving the cumulative likelihoods of the paths of the antecedents of a node and the likelihoods of the branches connecting said antecedents to said node for calculating said cumulative likelihood as a function of said cumulative likelihood of the path of the antecedents and of said likelihoods of the branches and for calculating the vector corresponding to the transition between said antecedents and said node; and a group of processing means, each having $q^{km+1}$ inputs for receiving the vector corresponding to the transition between said antecedents and said node and identical node level vectors of each sequence of vectors associated with the antecedents, each processing means supplying at an output a revised value which, apart from the oldest revised value, is applied to an input of an analog memory.

* * * * *